United States Patent [19]

Shichijo et al.

[11] 4,298,851
[45] Nov. 3, 1981

[54] PRESETTABLE TUNING APPARATUS

[75] Inventors: Hajime Shichijo, Kanagawa; Kenji Yamamoto, Chiba; Kenichi Nakazawa, Tokyo, all of Japan

[73] Assignee: Sony Corporation, Tokyo, Japan

[21] Appl. No.: 161,520

[22] Filed: Jun. 20, 1980

[30] Foreign Application Priority Data

Jun. 22, 1979 [JP] Japan .................................. 54-79507
Sep. 20, 1979 [JP] Japan ................................ 54-121340

[51] Int. Cl.³ ........................... H03J 5/08; H04B 1/26
[52] U.S. Cl. ..................................... 334/11; 455/175; 455/185; 455/186
[58] Field of Search ......................... 334/7, 11, 14–16; 455/175, 185, 186

[56] References Cited
U.S. PATENT DOCUMENTS 3,946,319  3/1976  Ma et al. ............................ 334/15 X
4,023,107  5/1977  Tanaka .............................. 334/15 X
4,220,922  9/1980  Ikeguchi ........................... 455/186 X Primary Examiner—Paul L. Gensler
Attorney, Agent, or Firm—Lewis H. Eslinger; Alvin Sinderbrand

[57] ABSTRACT

A presettable tuning apparatus includes a digital tuner; a source of digital signals representing radio frequencies to which the tuning apparatus is respectively tuned; an addressable memory having a plurality of sequentially addressable storage locations therein for storing selected ones of the digital signals; write-in circuitry for selectively writing the digital signals from the source into selected ones of the storage locations in the memory; a comparator circuit for comparing the digital signals stored in an adjacent pair of the sequentially addressable storage locations and providing a control signal indicating the relative values of the frequencies represented by such digital signals; and circuitry for replacing the digital signals stored in the pair of storage locations with one another when the control signal indicates that the frequency represented by the digital signal stored in the lower-address one of the pair of storage locations is higher than that represented by the signal stored in the higher-address one of the pair. The apparatus thereby automatically rearranges the particular storage locations in which the digital signals are stored so that the order of the frequencies represented thereby corresponds to the sequential order of the storage locations, notwithstanding that the digital signals can be written at random into the addressable memory.

9 Claims, 14 Drawing Figures

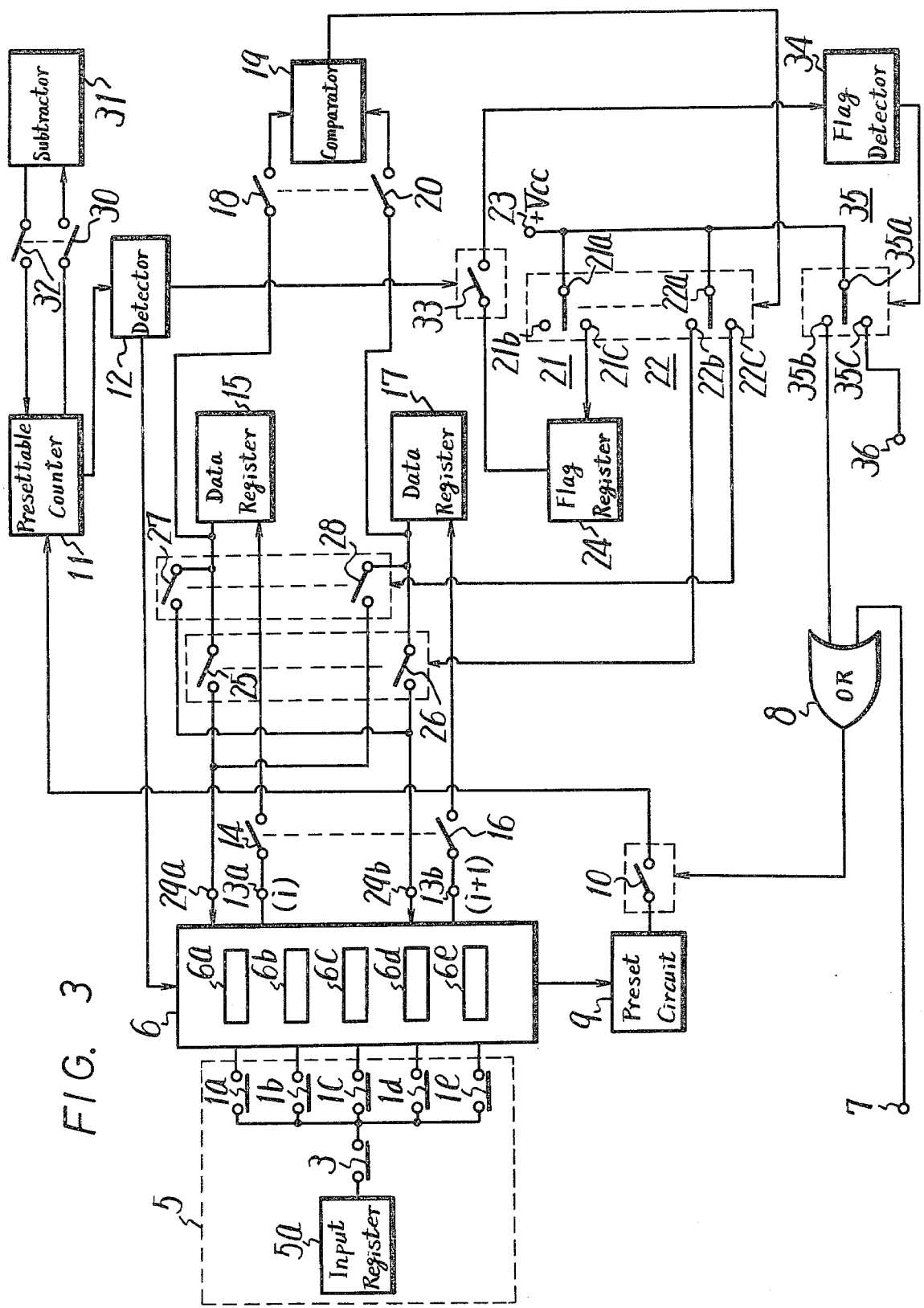

PRESETTABLE TUNING APPARATUS

BACKGROUND OF THE INVENTION

1. Field of the Invention

The present invention relates generally to a presettable tuning apparatus and is directed more particularly to a presettable tuning apparatus in which the direction of progression of the frequencies corresponding to stored digital signals in respect to the sequential order of the addresses, or storage locations of a memory is constant.

2. Description of the Prior Art

Recently, an FM/AM digital synthesizer receiver with presettable station function has been used widely. With a prior art preset tuning display device used in the above receiver and so on, key is associated with each previously preset station, and the preset key is pushed to tune the receiver and to digitally indicate or display the frequency of the preset station. However, with such a device it is impossible to instantaneously and clearly ascertain the preset broadcast stations and the relative positions of the keys corresponding thereto.

In the prior art, in order to display a preset broadcast station, a mechanical preset station display device of the dial type has recently been proposed. Such display device, however, is quite complex in construction. Further, with this display device, a previously preset station is display by the preset marker of the mechanical type Thus, if it is desired, for example, where five preset stations and five markers are used, to move the second marker to bring a preset marker to a position corresponding to a station positioned after the fifth marker, the second, third, fourth and fifth preset markers must be sequentially moved, which is incovenient is time consuming.

OBJECTS AND SUMMARY OF THE INVENTION

Accordingly, an object of the present invention is to provide a novel presettable tuning apparatus free from the defect inherent in the prior art.

Another object of the invention is to provide a presettable tuning apparatus in which after the digital signal corresponding to a broadcast station desired to be preset is written in an addressable memory, the content of the memory is re-arranged in accordance with the sequential order of the storage locations of the memory.

In accordance with an aspect of this invention, a presettable tuning apparatus includes a digital tuner; a source of digital signals representing radio frequencies to which the tuning apparatus is selectively tuned; and addressable memory having a plurality of sequentially addressable storage locations therein, with the storing locations being arranged in a sequential order from lower-address to higher-address storage locations; write-in circuitry for selectively writing the digital signals from the source into selected ones of the storage locations; a comparator circuit for comparing the digital signals stored in an adjacent pair of the sequentially addressable storage locations and providing a control signal indicating the relative values of the frequencies represented by the digital signals stored in such pair of storage locations; and circuitry for replacing the digital signals in the pair of storage locations with one another when the control signal of the comparator circuit indicates that the frequency represented by the digital signal stored in the loweraddress one of the pair of storage locations is higher than the frequency represented by the digital signal stored in the higheraddress one thereof. The apparatus thereby automatically rearranges the particular storage locations in which the digital signals corresponding to the selected radio frequencies are stored so that the order of such radio frequencies corresponds to the sequential order of the storage locations, notwithstanding that such digital signals can be written at random into the addressable memory.

Other objects, features and advantages of the present invention will become apparent from the following description taken in conjection with the accompaying drawings.

BRIEF DESCRIPTION OF THE DRAWINGS

FIG. 3 is a systematic block diagram showing an embodiment of the circuit used in the invention;

DESCRIPTION OF THE PREFERRED EMBODIMENT

The present invention will be hereinafter described with reference to the attached drawings.

Figure 1:
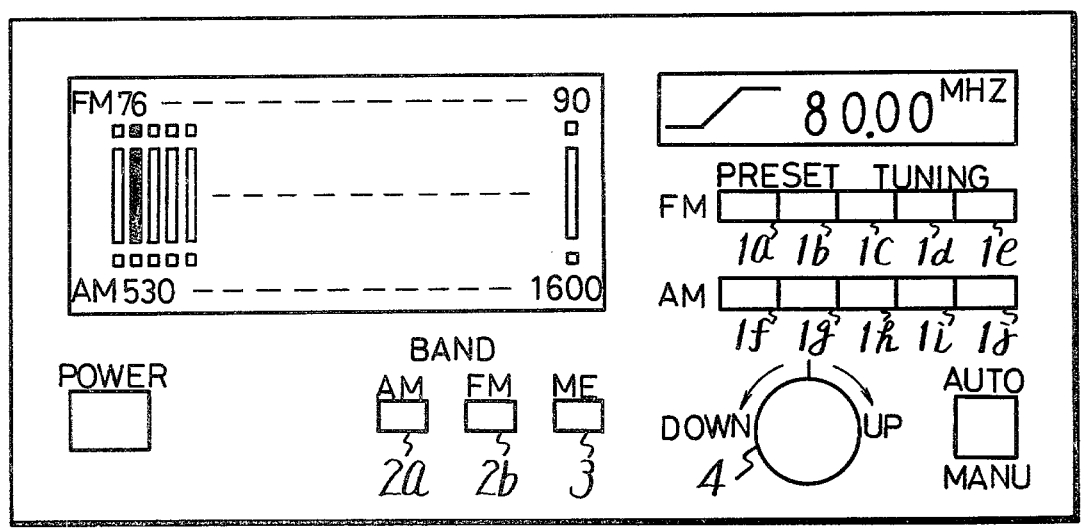
FIG. 1 is a front view of an embodiment of the presettable tuning apparatus according to the present invention.

FIG. 1 shows the front panel of a receiver to which the present invention is applied. In this receiver, there are provided five FM-station preset buttons $1a, \ldots 1e$ and also five AM-station preset buttons $1f, \ldots 1j$ for selecting stations in the FM and AM bands, respectively, AM and FM band change-over buttons $2a$ and $2b$, a write-in button 3 (marked with ME) for rendering the receiver in a presettable condition when a broadcast station is preset, a tuning knob 4 for achieving UP and DOWN scanning of the FM and AM bands, as well as other selectors and indicators.

Figure 2:
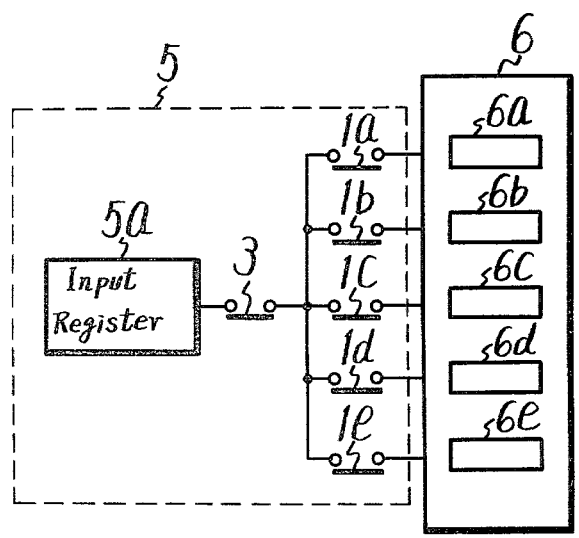
FIG. 2 is a circuit block diagram showing an embodiment of the memory control circuit used in the invention.

The method of entering a channel or station selecting signal into the memory of the presettable memory device of the above receiver will be described with reference to FIG. 2. Since the preset memory devices for the FM band and AM band are same in construction and operation, only the method with respect to the FM band will be described, but it is to be understood that the method in respect to the AM band would be essentially similar. For this reason, in FIG. 2 the construction of the preset device is shown only for the FM band, but it is to be understood that although the details of such construction for the AM band is omitted, the same would also be essentially similar.

To begin a preset operation, the band change-over button $2b$ is pushed to select the FM band. Then, the tuning knob 4 is rotated to tune the receiver's tuner circuit (not shown) to a desired broadcast station corresponding to a digital channel or station selecting signal from a micro computer, which can, for instance, control the programmable divider of a PLL (phase locked loop, which is not shown). This digital station selecting signal is stored in a preset memory input register $5a$, which together with preset button $1a-1e$ and write-in button 3 forms a preset memory input means 5. Then, the write-in button 3 is pushed down to be ON and hence to set the preset memory input means 5 into the write-in condition. In this case, for example, an automatic-return type switch is used as the write-in button 3, so that the write-in or memory stand-by condition is maintained, for example, for a period of 5 seconds. Thereafter, any one of addressing or preset station selecting buttons 1a, 1b, 1c, 1d, and 1e is actuated to select or appoint the address of a respective addressable preset memory 6a to 6e of an addressable or preset memory device 6 to thereby transfer and write the digital signal now stored in the input register 5a into memory device 6 at the predetermined address. In this case, when the preset button 1a is pushed to be ON, the station selecting digital signal memorized in the preset input register 5a is transferred to a first memory 6a of preset memory or storage location device 6 and then is written therein. Similarly, when the preset buttons 1b, 1c, 1d, and 1e are pushed to be ON, respectively, the digital signal stored in the preset input register 5a are transferred to second, third, fourth, and fifth memories, or storage locations 6b, 6c, 6d, and 6e of preset memory device 6 and then are written therein, respectively.

The write-in operation is carried out as above and then the preset is completed. When the station is received after it is preset, an appropriate one of the preset buttons 1a, 1b, 1c, 1d, and 1e is pushed to be ON to read out the station selecting digital signal stored in the corresponding one of the storage locations 6a to 6e of preset memory device 6. Then, the programmable divider of the PLL is controlled thereby to receive a desired broadcast station. In this case, if the preset button 1a is pushed, the digital station selecting signal written in the first storage locations 6a of preset memory device 6 is read out and a tuner circuit (not shown) is automatically tuned by the read out digital signal. Thus, the station corresponding to the digital station selecting signal stored in the first memory 6a of preset memory device 6 can be received. Similarly, if the preset buttons 1b, 1c, 1d, and 1e are pushed, respectively, the stations corresponding to the digital station selecting signals stored in the second, third, fourth, and fifth storage locations 6b, 6c, 6d, and 6e, respectively of preset memory device 6 can be received.

A receiver having the above presettable function can have its preset function performed as desired, that is, at random and without corresponding the order of the memories of preset memory device 6 to the order of frequencies of the broadcast stations. This is a desirable feature inasmuch as the order of the storage locations 6a to 6e seldom corresponds to that of the frequencies of the selected stations. Therefore, in order to ascertain that when a certain preset button is pushed, the desired station is received, it is necessary that the preset buttons be arranged in the increasing order of the frequencies of the stations.

Turning to FIG. 3, there will be described an example of the preset station selecting signal re-writing apparatus according to the present invention for achieving the above. In FIG. 3, the parts and elements corresponding to those of FIG. 2 are identified with the same references and their detailed description will be omitted.

In FIG. 3, a re-write start signal input terminal 7 is connected to one input terminal of an OR circuit 8. Here, the re-write start signal is automatically fed through the input terminal 7 to one input terminal of OR circuit 8 in synchronism with, for example, the return to the OFF condition of write-in button 3 after a station is written into a preset memory of preset memory device 6 by the preset memory input means 5.

In the figure, an initial value set circuit, or preset circuit 9 has its output side connected through a connecting switch 10 to an initial value input terminal of a presettable or preset counter 11 which provides as an output thereof an output count. Here, the preset circuit 9 is controlled by the control signal delivered from the preset memory device 6 to set as an initial value M, a number (N-1), where N represents the number of storage locations 6a to 6e in the preset memory device 6 that are preset with stations. The signal obtained at the output side of OR circuit 8 is fed to the connecting switch 10 as a control signal.

the output count of the counter 11 is supplied to the input side of a counter information detector 12 having first and second output terminals. Detector 12 supplies an output signal appearing at its first output terminal as a control signal to the preset memory device 6. Occurrence of this output signal indicates that the output count of presettable counter 11 has a value other than "0".

First and second output terminals 13a and 13b are provided from the preset memory device 6. The first output terminal 13a is connected through a connecting switch 14 to the input terminal of a comparing data register 15 to which a station selecting signal is thereby transferred from one of the storage locations of preset memory device 6, and the second output terminal 13b is connected through a connection switch 16 to the input terminal of a comparing data register 17 to which a station selection signal is thereby transferred from another selected one of the memories in the preset memory device 6. In response to the particular control signal supplied from the first output terminal of counter information detector 12 to the preset memory device 6, the particular storage locations 6a to 6e to be connected to the first and second output terminals 13a and 13b thereof are selected. For example, when the output count of presettable counter 11 is some number i, and i'th memory storage location of preset memory device 6 is connected to the first output terminal 13a and an (i+1)'th memory storage location of preset memory device 6 is connected to the second output terminal 13b. The connecting switches 14 and 16 are operated in ganged relation.

The output terminals of data registers 15 and 17 are respectively connected through connecting switches 18 and 20 to input terminals of a comparator 19 which compares the frequencies of the selecting signals from the data registers 15 and 17. The compared output signal from the comparator 19 is fed to change-over switches 21 and 22 as a control signal. In this case, the connecting switches 18 and 20 are operated in ganged relation. When the frequency of the station corresponding to the selecting signal from the data register 15 is higher than that of the station corresponding to the selecting signal from the data register 17, the comparator 19 produces a high level signal "1", but produces a low level signal "0" when the former is lower than the latter.

Change-over switch 21 has a movable contact piece 21a connected to a power supply terminal 23 which is furnished with a positive DC voltage +Vcc, one fixed contact 21b thereof electrically floated or isolated, and the other fixed contact 21c thereof connected to the input side of a flag register 24. Change-over switch 22 has a movable contact piece 22a connected to power supply terminal 23, one fixed contact 22b connected to control signal supplying terminals of respective connecting switches 25 and 26, and the other fixed contact 22c connected to control signal supplying terminals of respective connecting switches 27 and 28 to be described below. In this case, the change-over switches 21 and 22 are controlled in ganged relation by the output signal from the comparator 19. When the output signal from the comparator 19 is the low level signal "0", the movable contact 21a of switch 21 is connected to its fixed contact 21b and the movable contact 22a of switch 22 is connected to its fixed contact 22b. Thus, the DC voltage $+V_{cc}$ applied to the power supply terminal 23 is furnished to the connecting switches 25 and 26 as the control signals. However, when the output signal from the comparator 19 is the high level signal "1", the movable contact 21a of switch 21 is connected to its fixed contact 21c and the movable contact 22a of switch 22 is connected to its fixed contact 22c. Thus, the DC voltage $+V_{cc}$ is applied from the power supply terminal 23 to the flag register 24 to change its state from "0" to "1", and also to the connecting switches 27 and 28 as control signals therefor.

The output terminal of data register 15 is connected through the connecting switch 25 to a first input terminal 29a of the preset memory device 6, and also to its second input terminal 29b through the connecting switch 27. Similarly, the output terminal of data register 17 is connected to the second input terminal 29b of preset memory device 6 through the connecting switch 26 and also to the first input terminal 29a of preset memory device 6 through the connecting switch 28. Here, the connecting switches 25 and 26 are operated in ganged relation, and the connection switches 27 and 28 are operated also in ganged relation as mentioned previously. The first and second input terminals 29a and 29b are respectively connected by the control signal supplied from the counter information detector 12 to the preset memory device 6 at the memories thereof which correspond to the output count of counter 11. For example, when the output count of counter 11 is i, the first input terminal 29a is connected to the i'th memory storage location of preset memory device 6 and the second input terminal 29b is connected to the (i+1)'th memory storage location thereof, respectively.

The output terminal of counter 11 is connected through a connecting switch 30 to the input terminal of a subtractor 31 whose output terminal is in turn connected to the other input terminal of counter 11 through a connecting switch 32. The connecting switches 30 and 32 are operated in ganged relation. When switches 30 and 32 are both made ON, the output count counter 11 is transferred to the subtractor 31 to decrement the count in counter 11 by "1" and a new output count made smaller than the former by "1" is set back into the counter 11 by the subtractor 31.

The second output terminal of counter information detector 12 provides a control signal to a connecting switch 33. This control signal is provided as a "0" to close switch 33 to connect the output terminal of flag register 24 to the input terminal of a flag information detector 34. Here, when the output count of counter 11 is "0", the control signal applied to the connecting switch 33 acts to make the switch 33 ON.

A control signal is supplied from the output side of flag information detector 34 to a change-over switch 35 having a movable contact piece 35a connected to the power supply terminal 23. The change-over switch 35 has one fixed contact 35b connected to a second input terminal of OR circuit 8, the first input terminal being connected to the re-write start signal input terminal 7 as set forth previously, and another fixed contact 35c connected to a processing finishing signal output terminal 36. When the state of flag register 24 is "1", the movable contact 35a of switch 35 is connected to its fixed contact 35b by the control signal applied thereto from the flag information detector 34 to apply the positive DC voltage $+V_{cc}$ from the power supply terminal 23 to the other input terminal of OR circuit 8 which then produces a re-processing start signal. Otherwise, when the state of flag register 24 is "0", the movable contact 35a to switch 35 is connected to its other fixed contact 35c by the control signal applied thereto from the flag information detector 34. Thus, the positive DC voltage $+V_{cc}$ is applied from the power supply terminal 23 to the output terminal 36 to finish the process. Further, when the state of flag register 24 is supplied to flag information detector 34, the former is reset to its "0" state. The remaining construction of the example shown in FIG. 3 is substantially the same as that of FIG. 2.

Figure 4A:
FIGS. 4A through 4J constitute a timing chart used to explain the operation of the circuit shown in FIG. 3.

Now, the operation of the apparatus of FIG. 3, where three FM broadcast stations are preset, will be described with reference to FIGS. 4A to 4J. FIG. 4A shows a clock signal for a timing control circuit (not shown). Based upon this clock signal, the ganged connecting switch pairs 14, 16; 18, 20; and 30, 32 are switched at the timings shown in FIGS. 4C, 4D, and 4H, respectively. The band change-over button 2b shown in FIG. 1 is pushed to select the FM band, that is, to set the receiver to be in condition to receive the FM station. Then, the tuning knob 4 shown in FIG. 1 is rotated to tune the tuner circuit to the station at the frequency of, for example, 82.9 MH$_z$ and the station selecting signal to select this station frequency of 82.9 MH$_z$ is stored in the preset memory input register 5a. Next, the write-in button 3 is pushed ON to enable the register to carry out writing and the preset button 1a is then pushed ON within a predetermined time, for example, 5 seconds, so that the apparatus is capable of writing the station selecting signal corresponding to the station frequency of 82.9 MH$_z$ into the first storage location 6a of preset memory device 6. Similarly, the signals corresponding to the station frequencies, for example, 81.0 MH$_z$ and 80.0 MH$_z$ are written in the second and third storage locations 6b and 6c of preset memory device 6, respectively.

A significant aspect of the present invention resides in its capability to re-write the stored station selecting signals after they have been entered at random into memory device 6.

Now will be described the re-write operation achieved according to this invention.

Figure 4B:

When the appropriate station selecting signals have been written into the memory storage locations of preset memory device 6 and thereafter the re-write start signal is supplied to the terminal 7, for example, in synchronism with the switching OFF of write-in button 3, the control signal is supplied to the connecting switch 10 from the OR circuit 8 to turn the switch 10 ON within a predetermined time period at timing tb shown in FIG. 4B. Thus, an initial value M (where M is "2") is applied from the initial value set or preset circuit 9 to the initial value input terminal of counter 11 to set therein the initial count 2. At the same time that the initial count "2" is set in counter 11, the control signal is supplied from the counter information detector 12 to the preset memory device 6 to connect the second storage location 6b with the first output terminal 13a and also to connect the third storage location 6c with the second output terminal 13b.

Figure 4C:

Next, at timing tc shown in FIG. 4C, the connecting switches 14 and 16 are turned ON in ganged relation in a given period in synchronism with the switching OFF of connecting switch 10 to supply the selecting signals (corresponding to the station frequencies of 81.0 MHz and 80.0 MHz) stored in the second and third storage locations 6b and 6c to data registers 15 and 17, respectively.

Figure 4D:

Then, at timing td shown in FIG. 4D, the connecting switches 18 and 20 are turned ON in a given period in synchronism with the switching OFF of switches 14 and 16 to supply the selecting signals from the data registers 15 and 17 to both input terminals of comparator 19, respectively, which in turn compares the frequencies of both the selecting signals. Here, since the frequency (81.0 MHz) of the station corresponding to the selecting signal from the data register 15 is higher than the frequency (80.0 MHz) of the station corresponding to the selecting signal from the data register 17, the comparator 19 produces a high level signal, or "1", indicating that a re-write operation is necessary.

Figure 4E:
Figure 4F:
Figure 4G:

Next, at timing te shown in FIG. 4E, the change-over switches 21 and 22 are controlled by the compared output from the comparator 19. Since the output from the comparator 19 is "1", the movable contact pieces 21a and 22a of switches 21 and 22 are connected to fixed contacts 21c and 22c, respectively. As a result, the positive DC voltage $+V_{cc}$ from the power supply terminal 23 is supplied to the input side of flag register 24 to thereby change its state from "0" to "1" at the timing shown in FIG. 4F, and also to the connecting switches 27 and 28 as the control signal to render them ON in a given period at the timing shown in FIG. 4G. Thus, the selecting signal (corresponding to the station frequency of 81.0 MHz) from the data register 15 and the selecting signal (corresponding to the station frequency of 80.0 MHz) from the data register 17 are supplied to the second and first input terminals 29b and 29a of preset memory device 6, respectively. In this case, since the output count of counter 11 is "2" and the control signal is fed from the counter information detector 12 to the preset memory device 6, the first and second input terminals 29a and 29b, are connected to the second and third storage locations 6b and 6c, respectively. Accordingly, the selecting signal (corresponding to the station frequency of 81.0 MHz) from the data register 15 and the selecting signal (corresponding to the station frequency of 80.0 MHz) are transferred to the third and second storage locations 6c and 6b, respectively to perform the re-write operation.

Figure 4H:
Figure 4I:
Figure 4J:

Next, at timing th shown in FIG. 4H the connecting switches 30 and 32 are made ON in ganged relation in synchronism with the switching OFF of switches 27 and 28 to thereby change the output count of counter 11 from "2" to "1".

Since the output count of counter 11 becomes "1" at this time, the connecting switches 30 and 32 are turned OFF. Then, a predetermined period later, the connecting switches 14 and 16 are turned ON again in ganged relation as shown in FIG. 4B, so that the selecting signal (corresponding to the station frequency of 82.9 MHz) stored in the first storage location 6a and the selecting signal (corresponding to the station frequency of 80.0 MHz) memorized in the second storage location 6b are transferred to data registers 15 and 17, respectively. An operation similar to the operation described above will be thus carried out. In this case, since the frequency (82.9 MHz) of the station selected by the selecting signal from the data register 15 is higher than that (80.0 MHz) of the station selected by the selecting signal from the data register 17, the selecting signal from the data register 15 is transferred to the second memory 6b while that from the data register 17 is transferred to the first memory 6a to achieve an appropriate re-write operation. At this time, the output count of counter 11 is changed from "1" to "0".

Since the value of counter 11 is now "0" rather than "1", the connecting switches 30 and 32 turn OFF. A predetermined period later, the control signal is furnished from the counter information detector 12 to the connecting switch 33 to render it ON at timing ti shown in FIG. 4I. As a result, the state of flag register 24 is detected by the flag information detector 34 which then supplies the control signal therefrom to the change-over switch 35.

Since the re-write operation has been carried out in the above two repetitions, the state of flag register 24 is "1" (which means that re-processing is necessary). Therefore, the movable contact piece 35a of change-over switch 35 is connected to fixed contact 35b by the control signal supplied from the flag information detector 34 at the timing tj shown in FIG. 4J. Thus, the positive DC voltage $+V_{cc}$ is applied from the power supply terminal 23 to one input terminal of OR circuit 8 which in turn produces an output signal, so that the connecting switch 10 is made ON at the timing tb shown in FIG. 4B. Thus, the initial value "2" is again set in the counter 11 from the preset circuit 9 to start processing operation or reprocessing operation again.

This re-processing operation will be achieved in a manner entirely similar to the manner described above. That is, since the output count of counter 11 is "2", the selecting signal (corresponding to the station frequency of 82.9 MHz) stored in the second storage location 6b and that (corresponding to the station frequency of 81.0 MHz) stored in the third storage location 6c are transferred to the data registers 15 and 17, respectively. In this case, since the station frequency (82.9 MHz) selected by the selecting signal from the data register 15 is higher than that (81.0 MHz) selected by the selecting signal from the data register 17, re-write is necessary and the state of flag register 24 is made "1". At this time, the selecting signal from the data register 15 is transferred to the third storage location 6c and that from the data register 17 is transferred to the second storage location 6b to carry out the re-write operation. Immediately thereafter, the value of counter 11 is changed from "2" to "1".

Next, since the value of counter 11 is "1", the selecting signal (corresponding to the station frequency of 80.0 MHz) stored in the first storage location 6a and that (corresponding to the station frequency of 81.0 MHz) stored in the second storage location 6b are transferred to the data registers 15 and 17, respectively. In this case, since the station frequency (80.0 MHz) of the station selected by the selecting signal from the data register 15 is lower than that (81.0 MHz) of the station selected by the selecting signal from the data register 17, no further re-write is required. Thus, at the timing shown in FIG. 4F, the connecting switches 25 and 26 are made ON in ganged relation, so that the selecting signal (corresponding to the station frequency of 80.0 MHz) from the data register 15 and that (corresponding to the station frequency of 81.0 MHz) from the data register 17 are respectively transferred to the first and second storage locations 6a and 6b. At this time, the output count of counter 11 is changed from "1" to "0".

In this case, although the output count of counter 11 is "0", the state of flag register 24 is "1" (thereby indicating that a further re-process operation is necessary). Therefore, the re-processing is started again.

As described above, the counter 11 is again set at "2", so that the selecting signal (corresponding to the station frequency of 81.0 MHz) stored in the second storage location 6b and that (corresponding to the station frequency of 82.9 MHz) stored in the third storage location 6c are respectively transferred to the data registers 15 and 17. In this case, since the frequency (81.0 MHz) of the station selected by the selecting signal from the data register 15 is lower than that (82.9 MHz) selected by the selecting signal from a data refister 17, the re-write operation is not necessary. Thus, the selecting signals from the data registers 15 and 17 are transferred to the second and third storage locations 6b and 6c, respectively. At this time, the output count of counter 11 is changed from "2" to "1".

Next, since the output count of counter 11 is "1", the selecting signal (corresponding to the station frequency of 80.0 MHz) stored in the first storage location 6a and that (corresponding to the station frequency of 81.0 MHz) stored in the second storage location 6b are transferred to the data registers 15 and 17, respectively. In this case, since the frequency (80.0 MHz) of the station selected by the selecting signal from the data register 15 is lower than that (81.0 MHz) of the station selected by the selecting signal from the data register 17, the re-write is unnecessary. Thus, the selecting signals from the data registers 15 and 17 are transferred to the first and second storage locations 6a and 6b, respectively. At this time, the output count of counter 11 is changed from "1" to "0".

Next, although the output count of counter 11 is "0", the state of flag register 24 is "0" (indicating that no further re-process is required because the above reprocess operation has been repeated two times. Therefore, the movable contact piece 35a of change-over switch 35 is connected to fixed contact 35c upon occurrence of the control signal supplied from the flag information detector 34 with the result that the power supply terminal 23 supplies a process termination signal to the process termination output terminal 36 to terminate the re-write operation.

As described above, after the re-write operation has been carried out, the sequential order of the storage locations 6a to 6e in the preset memory device 6 corresponds to the order of the increasing frequencies of the stations. Hence, the selecting signals for selecting the stations of 80.0 MHz, 81.0 MHz, and 82.9 MHz are stored in the first, second, and third storage locations 6a, 6b and 6c of preset memory device, 6, respectively.

Accordingly, the station of 80.0 MHz is preset at the preset selecting button 1a, so that if this button 1a is pushed, the station of 80.0 MHz can be received. Similarly, the stations of 81.0 MHz and 82.9 MHz are preset to correspond to the preset selecting buttons 1b and 1c, respectively, so that if the buttons 1b and 1c are respectively pushed, the stations of 81.0 MHz and 82.9 MHz can be received.

In other words, according to the present invention, after the station selecting signals have been written at random into the storage locations of preset memory device 6 a re-write is carried out such that the order of the numbered storage locations in the preset memory device 6, i.e., the order of preset selecting buttons 1a, 1b, 1c, 1d, and 1e corresponds to the increasing order of the frequencies of the stations, and hence the order of the buttons 1a, 1b, 1c, 1d and 1e is in correspondence with the order of increasing frequencies of the stations. Therefore, the selecting signals for the stations can be easily entered into the memory device 6.

Figure 5:
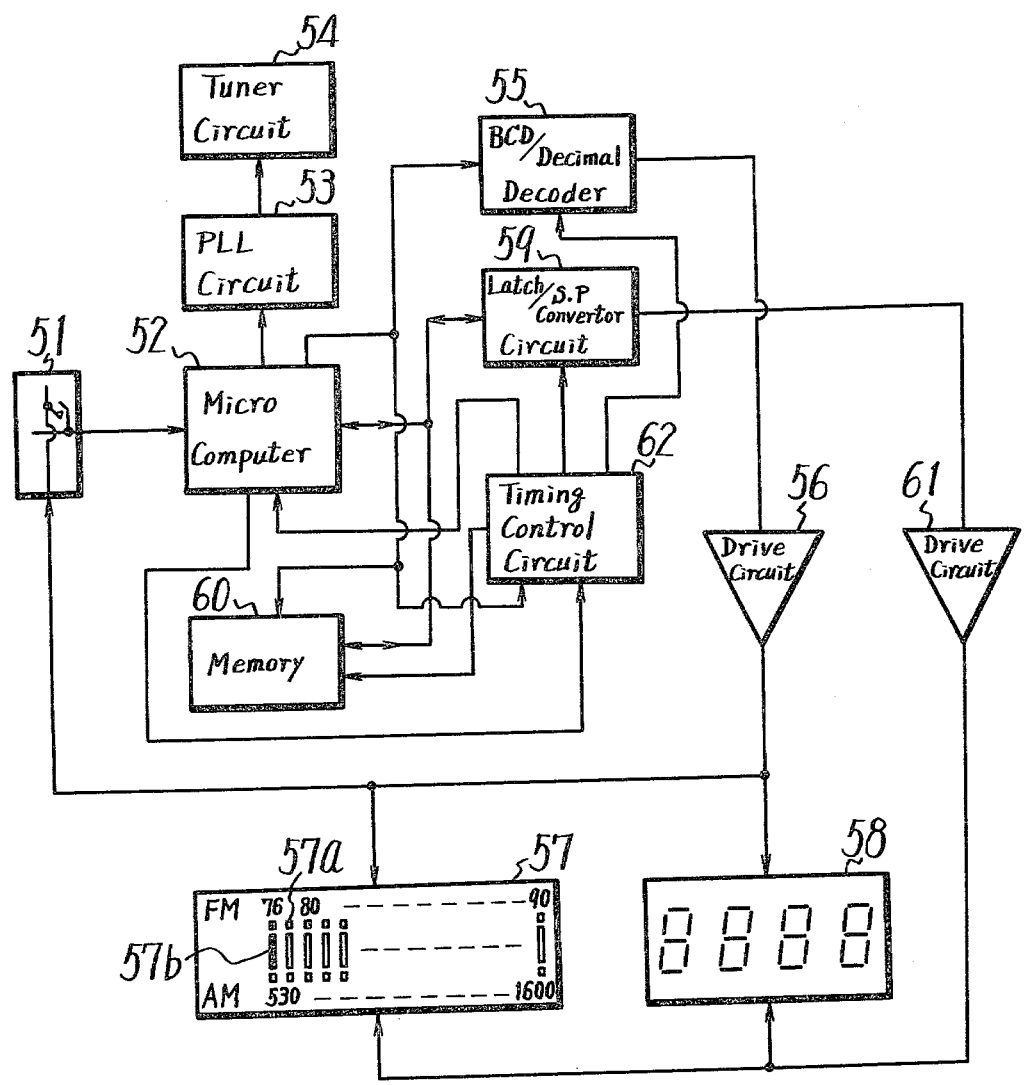
FIG. 5 is a systematic block diagram showing another embodiment of the invention.

Turning to FIG. 5, another example of the invention will be described.

In FIG. 5, an operating member 51 is arranged, for example, as shown in FIG. 1, as a plurality of, five preset selecting buttons 1a to 1e and five buttons 1f to 1j for the FM and AM bands, respectively, AM and FM band change-over buttons 2a and 2b, write-in button 3, change-over button AUTO/MANU for changing the auto and manual operation, and UP and DOWN knob 4 for sweeping the frequency of the receiver in the up or down direction. The output signal from the operating member 51 is fed to a micro computer 52 which achieves a calculation in response to the content of the output signal from the operating member 51. The output from the micro computer 52 is supplied to a PLL (phase locked loop) circuit 53 which controls a tuner circuit 54. The PLL circuit 53 and tuner circuit 54 form a so-called synthesizer circuit which has an electronic tuning function in response to the output from the micro computer 52. This part, however, does not embody the essence of this invention, and its detailed description will be omitted.

In FIG. 5, a decoder 55 will produce a figure drive signal corresponding to each of several digital figures representing the frequency. This decoder 55 converts an address signal, for example, BCD (binary coded decimal) signal of 4 bits from the micro computer 52 to a decimal signal. This decimal signal is fed through a drive circuit 56 to a dial display device 57, which uses, for example, dynamically-lit phosphor display tubes, and is also fed to a digital frequency display device 58. The dial display device 57 consists of a plurality of frequency dot display segments or members 57a located in correspondence with a frequency scale and a plurality of pointer display segments or members 57b arranged in correspondence with the frequency dot display members 57a and has a frequency scale which, in the embodiment of FIG. 5, is appropriate for use in Japan.

In FIG. 5, a latch circuit or latch /s.p (series-parallel) converter circuit 59 latches and converts a series data signal of, for example, 4 bits read out from the external memory 60 in response to the call from the micro computer 52, in the form of a parallel data signal. This converted data signal is fed through a drive circuit 61 to the dial display device 57 and the frequency display device 58 as a sequential drive signal. The external memory 60 is a non-volatile memory which stores the preset digital code corresponding to the received frequency, and is usually used as a back-up memory when the data storage capacity of the memory included in the micro computer 52 is insufficient. A timing control circuit 62 is also provided to control the timings of the respective circuits. That is, this timing control circuit 62 latches the address signals fed from the micro computer 52 to the decoder 55 and to the memory 60 with a strobe signal fed thereto from the micro computer 52 and produces control signals to establish the timing of the respective circuits.

Now, a description will be given on the operation of the example shown in FIG. 5. Firstly, the operation will be described in which preset stations are sequentially written in the memory 60 in correspondence with the preset selecting buttons, for example, 1a to 1e. When power is supplied to the receiver, the frequency dot displayer member 57a positioned beneath 90 MH$_z$ of dial display device 57 is lit, indicating that all preset data are stored. That is, the lighting of member 57a means that a new preset data can be input. Thus, when the station of, for example, 80 MH$_z$ is preset by, for example, FM band preset button 1a, the UP and DOWN knob 4 in the operating member 51 is operated in an automatic or manual manner to tune the tuner circuit 54 to 80 MH$_z$. When tuned to 80 MH$_z$, the pointer segment 57b of dial display device 57 corresponding to the frequency 80 MH$_z$ is lit and also 80 MH$_z$ is digitally displayed on the digital frequency display device 58. At this time, if the write-in button 3 is pushed, the apparatus goes into the stand-by state. When the preset selecting button 1a is pushed within a given period of time, for example, 5 second after achieving the stand-by state, this state is checked by the micro computer 52 and thereafter data corresponding to the station frequency of 80 MH$_z$ is memorized at a given address in the memory 60.

Next, when the station frequency of 82.5 MH$_z$, by way of example, is preset by the preset selecting button 1b, similar to the corresponding operation for the station frequency of 80 MH$_z$, at the time when tuned to 82.5 MH$_z$ and the stand-by state is presented by the write-in button 3, data corresponding to the station of 82.5 MH$_z$ are stored in the memory 60 at its given address by pushing the preset selecting button 1b. If the memorized contents are read out at this time, the frequency dot display members 57a at 80 MH$_z$, 82.5 MH$_z$, and 90 MH$_z$ are lit, respectively, and the stations 80 MH$_z$ and 82.5 MH$_z$ are preset at the positions corresponding to the preset selecting buttons 1a and 1b, respectively. In this case, the lighting of frequency dot display member 57a at 90 MH$_z$ means that further new stations can be preset at the positions corresponding to the preset selecting buttons 1c to 1e. During the above reading out of the preset button, some of preset selecting buttons in those 1a to 1e, which are pushed now, are checked by the micro computer 52, and the data corresponding to the pushed preset selecting buttons are read out from the memory 60 and latched by the latch circuit 59. After data corresponding to one station frequency are all prepared, the display devices 57 and 58 are dynamically lit by the drive signal from the decoder 55. This operation will be repeated for each of the selected station frequencies.

Next, when the station having a frequency lower than the station of frequency 82.5 MH$_z$, for example, 81.9 MH$_z$, is preset at the position corresponding to the preset selecting button 1c, the UP and DOWN knob 4 of operating member 51 is rotated to scan the frequency in the lower direction to tune the receiver to 81.9 MH$_z$ similar to the above operation for the foregoing stations. Then, the write-in button 3 is pushed to achieve the stand-by state. At this time, by pushing the preset selecting button 1c, the station of 81.9 MH$_z$ is written into and stored in the memory 60.

According to the example of the invention shown in FIG. 5, though the station of 81.9 MH$_z$ is preset at the position corresponding to the preset selecting button 1c, it is discriminated by a data editing routine of micro computer 52 whether or not the data of this station represent a frequency greater than those of the other stations. Then, the preset stations are rearranged to make the arranging order of frequency dot display members 57a as displayed coincident with the order of the corresponding preset selecting buttons. In other words, if the contents of memory 60 are read out, the frequency dot display members 57a at 80 MH$_z$, 81.9 MH$_z$, 82.5 MH$_z$, and 90 MH$_z$ are lit, respectively, to display that at the positions corresponding to the preset selecting buttons 1a, 1b, and 1c, respectively, there are preset stations with frequencies of 80 MH$_z$, 81,9 MH$_z$, and 82.5 MH$_z$ i.e., in the order of increasing frequencies in correspondence with the order of arrangement of the frequency dot display members 57a, and that the memory locations in memory 60 corresponding to the remaining preset selecting buttons 1d and 1e are still empty.

Now, the case will be considered in which a station already preset at the position corresponding to the preset selecting button 1b is erased and a new station is preset in place thereof. Now, assuming that the frequency of this new station desired to be preset, is taken as 85.1 MH$_z$ knob 4 is turned to 85.1 MH$_z$, if the preset selecting button 1b is pushed while the receiver is in the standby state achieved by pushing the write-in button 3, the station of 85.1 MH$_z$ is written into and stored in the memory 60. In this case, also the data editing routine of micro computer 52 rearranges the contents in the external memory 60 so that when any one of the preset selecting buttons is pushed to receive the corresponding station, the preset selecting buttons also correspond to the order of frequency dot display members 57a beginning from the left side. That is, if the contents are read out at this time, the frequency dot display members 57a at 80 MH$_z$, 82.5 MH$_z$, 85.1 MH$_z$, and 90 MH$_z$ are lit, respectively, to display that the stations of 80 MH$_z$, 82.5 MH$_z$, and 85.1 MH$_z$ are preset at the positions corresponding to the preset selecting buttons 1a, 1b, and 1c in correspondence with the order of frequency dot display members 57a, and that new stations can be preset at the positions corresponding to the remaining preset selecting buttons 1d and 1e.

When respective stations have been preset at the positions corresponding to all the preset selecting buttons, upon reading out, the frequency dot display members 57a corresponding to the respective preset selecting buttons are lit while the frequency dot display member 57a at 90 MH$_z$ is extinguished to display that all the preset selecting buttons 1a to 1e are preset with respective stations.

As will be apparent from the above description, according to the present invention, when the station selecting signals are written in the memories of preset memory device 6, it is unnecessary that the stations be preset in the same order as their respective frequencies, but it is possible instead to preset the stations at random. Therefore, the present invention is free of the trouble inherent in prior-art receivers, that every time when a new station is preset, the person performing the preset operation must take into consideration not only the frequency of a new station, but also the frequencies of those of already preset.

In the above examples of the invention, any five FM stations can be preset, but it will be readily apparent that any number of selecting buttons 1a to 1e can be included in the receiver and the similar re-write operation is possible for any desired number of preset stations.

Many modifications and variations can be effected by one skilled in the art without departing from the spirit or scope of the invention which is to be determined by the appended claims.

We claim as our invention:

1. A presettable tuning apparatus comprising tuning means for tuning to a selected radio frequency;

a source of digital signals representing radio frequencies to which the tuning apparatus is selectively tuned;

addressable memory means having a plurality of sequentially addressable storage locations therein for storing selected ones of said digital signals, the storage locations being arranged in a sequential order from lower-address to higher-address storage locations;

write-in means for selectively writing the digital signals from said source into selected ones of said storage locations in said memory means;

comparator means for comparing the digital signals stored in an adjacent pair of said sequentially addressable storage locations and providing a control signal indicating the relative values of the frequencies represented by the digital signals stored in said pair of storage locations; and means for replacing the digital signals in said pair of storage locations with one another when the control signal of said comparator means indicates that the frequency represented by the digital signal stored in the lower-address one of said pair of storage locations is in a predetermined relationship to the frequency represented by the digital signal stored in the higher-address one thereof;

said presettable tuning apparatus thereby automatically rearranges the particular storage locations, in which digital signals corresponding to the selected radio frequencies are stored, so that the order of such radio frequencies corresponds to the sequential order of said storage locations, notwithstanding that such digital signals can be written at random into said addressable memory means.

2. A presettable tuning apparatus according to claim 1, wherein said comparator means includes first and second data register means for storing the digital signals stored in said lower-address and said upper-address storage locations of said pair of storage locations, respectively, and a data comparator for comparing the contents of said first and said second data register means.

3. A presettable tuning apparatus according to claim 2, further comprising a presettable counter for initially storing a count corresponding to the number of said storage locations in which said digital signals are stored, and means for determining, in response to the count stored in said presettable counter, the successive two of said storage locations to constitute the adjacent pair to be connected to said first and second data register means.

4. A presettable tuning apparatus according to claim 3, further comprising means for decrementing the count stored in said presettable counter following the comparing of said digital signals stored in said adjacent pair of storage locations.

5. A presettable tuning apparatus according to claim 4, wherein said means for decrementing includes a subtractor connected to said presettable counter so as to decrement the count thereof by one step upon each comparison of said digital signals stored in said adjacent pair of memory locations; and wherein said means for determining progressively couples lower-address ones of said storage locations to said first and second data register means until the count of said presettable counter reaches a predetermined value.

6. A presettable tuning apparatus according to claim 1, further comprising a flag register for storing said control signal of said comparator means, and flag detector means responsive to said flag register for determining whether the frequencies corresponding to the digital signals stored in said storage locations are arranged in order in respect to the sequential order of said storage locations.

7. A presettable tuning apparatus according to claim 6, further comprising means responsive to said flag detector means for causing said apparatus to repeat the automatic rearranging of the storage locations when said digital signals are determined not to be in order, and for causing the apparatus to halt when the digital signals are determined to be in order.

8. A presettable tuning apparatus according to claim 1, wherein said tuning means includes a digitally controlled tuner controlled by said digital signals; further comprising means for reading selected ones of said digital signals out of said storage locations of said memory means, and applying the read-out digital signals to said digitally controlled tuner.

9. A presettable tuning apparatus according to claim 1, wherein said predetermined relationship is that the frequency represented by the digital signal stored in the lower-address one of said pair of storage locations is higher than the frequency represented by the digital signal stored in the higher-address one thereof.

* * * * *